United States Patent
Izunome et al.

[11] Patent Number: 5,683,504
[45] Date of Patent: Nov. 4, 1997

[54] GROWTH OF SILICON SINGLE CRYSTAL

[75] Inventors: Koji Izunome, Ami-machi; Souroku Kawanishi, Tsukuba; Shinji Togawa, Tsukuba; Atsushi Ikari, Tsukuba; Hitoshi Sasaki, Omiya; Shigeyuki Kimura, Tsukuba, all of Japan

[73] Assignees: Research Development Corporation of Japan, Saitama-ken; Sumitomo Sitix Corporation, Hyogo-ken; Toshiba Ceramics Co., Ltd.; Nippon Steel Corporation, both of Tokyo; Komatsu Electronic Metals Co., Ltd., Kanagawa-ken; Mitsubishi Materials Corporation, Tokyo, all of Japan

[21] Appl. No.: 621,054

[22] Filed: Mar. 22, 1996

[30] Foreign Application Priority Data

Mar. 24, 1995 [JP] Japan .................. 7-091432

[51] Int. Cl.$^6$ ........................ C30B 15/20
[52] U.S. Cl. ................ 117/13; 117/14; 117/15; 117/30; 117/901
[58] Field of Search ............... 117/13, 14, 15, 117/30, 901

[56] References Cited

U.S. PATENT DOCUMENTS 4,971,652  11/1990  Azad ........................ 117/15
5,162,072  11/1992  Azad ........................ 117/15

FOREIGN PATENT DOCUMENTS 0042296  3/1983  Japan ........................ 117/15

*Primary Examiner*—Felisa Garrett
*Attorney, Agent, or Firm*—Webb Ziesenheim Bruening Logsdon Orkin & Hanson, P.C.

[57] ABSTRACT

When a single crystal is pulled up from a melt, the difference $\Delta T$ between temperatures at the bottom of a crucible and at the interface of crystal growth is controlled so as to hold the Rayleigh constant defined by the formula of:

$$R_a = g \cdot \beta \cdot \Delta T \cdot L / \kappa \cdot \nu$$

within the range of $5 \times 10^5$–$4 \times 10^7$, wherein g represents the acceleration of gravity, $\beta$ the volumetric expansion coefficient of the melt, L the depth of the melt, $\kappa$ thermal diffusivity and $\nu$ the kinematic viscocity. Since the convection mode of the melt at the interface of crystal growth is constantly held in the region of soft turbulence, a single crystal is grown under the stabilized temperature condition without the transfer of the impurity distribution in the melt into the growing single crystal.

1 Claim, 2 Drawing Sheets

GROWTH OF SILICON SINGLE CRYSTAL

BACKGROUND OF THE INVENTION

The present invention relates to a method of growing a Si single crystal having an impurity distribution made uniform along the direction of crystal growth by controlling the vortex of a melt below the interface of crystal growth, when the single crystal is pulled up from the melt according to the Czochlarski method.

The Czochralski method is a representative method for the growth of a Si single crystal from a melt.

The Czochralski method uses a crucible 2 provided in a closed chamber 1 as shown in FIG. 1. The crucible 2 is supported by a support 3 so that the crucible 2 is capable of rotation and/or vertical motion. A heater 4 and a heat insulator 5 are concentrically disposed around the crucible 2, so as to hold the melt 6 at a temperature suitable for the growth of a Si single crystal.

A seed crystal 7 is located in contact with the melt 6, so as to grow a Si single crystal 8 having the crystalline orientation imitating the orientation of the seed crystal 7. The seed crystal 7 is hung down through a wire 9 from a rotary winder 10 or a rigid pulling-up rod, and gradually pulled upwards in response to the degree of crystal growth. The crucible 2 is descended by the proper rotating motion of the support 3, too. The descending and rotating speed of the support 3 as well as the ascending and rotating speed of the seed crystal 7 are controlled in response to the growing speed of the Si single crystal 8 being pulled up from the melt 6.

The single crystal obtained by Czochralski method has an impurity distribution along the direction of crystal growth. The microscopic impurity distribution is significantly affected by the convection state of the melt just below the interface of crystal growth.

Since the melt in large amount remains in the crucible at the initial stage of pulling-up operation, the interface of crystal growth has sufficient height above the bottom of the crucible. The melt in this state flows into the interface of crystal growth as the soft turbulence which does not have any special flow-fluid structure. The single crystal grown up from the melt has the impurity distribution which imitates the melt convection.

Since the amount of the melt remaining in the crucible becomes smaller as the growth of the single crystal, the melt flow changes to the state of periodic vortex having specified structure, as shown in FIG. 2. As the melt flow changes to the state of periodic vortex, the impurity non-uniformity which reflects the uneven distribution of impurities in the melt appears in the grown-up single crystal. The impurity non-uniformity has been regarded as inevitable in the conventional Czochralski method, so that the latter half of the crystal has properties out of standards.

SUMMARY OF THE INVENTION

The present invention is accomplished to overcome the problems above-mentioned.

The object of the present invention is to produce a high-quality Si single crystal having an impurity distribution made uniform along the direction of crystal growth, while increasing the ratio of the parts which have uniform impurity distribution in one crystal, by controlling the melt convection near the interface of crystal growth.

When a Si single crystal is pulled up from a melt according to the present invention, the difference $\Delta T$ between temperatures at the bottom of a crucible and at the interface of crystal growth is controlled so as to hold the Rayleigh constant R, defined by the formula of:

$$R_a = g \cdot \beta \cdot \Delta T \cdot L / \kappa \cdot \nu$$

within the range of $5 \times 10^5 - 4 \times 10^7$, wherein g represents the acceleration of gravity, $\beta$ the volumetric expansion coefficient of the melt, L the height of the melt above the bottom of the crucible, $\kappa$ thermal diffusivity, and $\nu$ kinematic viscocity.

DETAILED DESCRIPTION OF THE PREFERRED EMBODIMENTS the Rayleigh constant $R_a$ is the dimensionless number which indicates the state of melt convection derived from the difference in bouyancy, and equal to the ratio of bouyancy to viscocity. When a fluid disposed on the ground is heated at the upper part and cooled at the lower part, the convection flows at $R_a$ above 1700. The fluid changes to complete turbulence at $R_a$ above approximately $10^{10}$. When a single crystal is grown from the melt by the Czochlarski method, the Rayleigh constant is at a value of $10^5-10^8$, so that the melt flow does not change to the complete turbulent state.

While the factors of Rayleigh constant $R_a$, i.e. the acceleration of gravity g, the volumetric expansion coefficient $\beta$, the thermal diffusivity $\kappa$ and the kinematic viscocity $\nu$ are constant values, the temperature difference $\Delta T$ and the depth L of the melt are varied during the growth of the single crystal. These factors are the physical quantities which can be monitored during the operation. The temperature difference $\Delta T$ is represented by the formula of (a temperature at the bottom of the crucible—the melting point of the melt), since the interface of crystal growth is held at a constant temperature.

Figure 1:
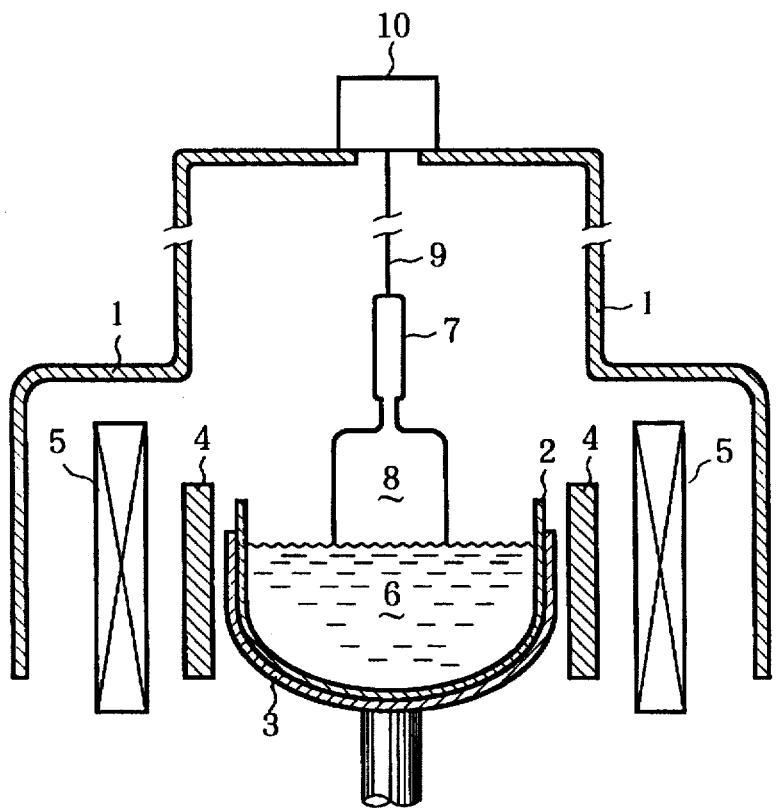
FIG. 1 is a schematic view for explaining the Czochlarski method of pulling up a Si single crystal from a melt.
Figure 2:
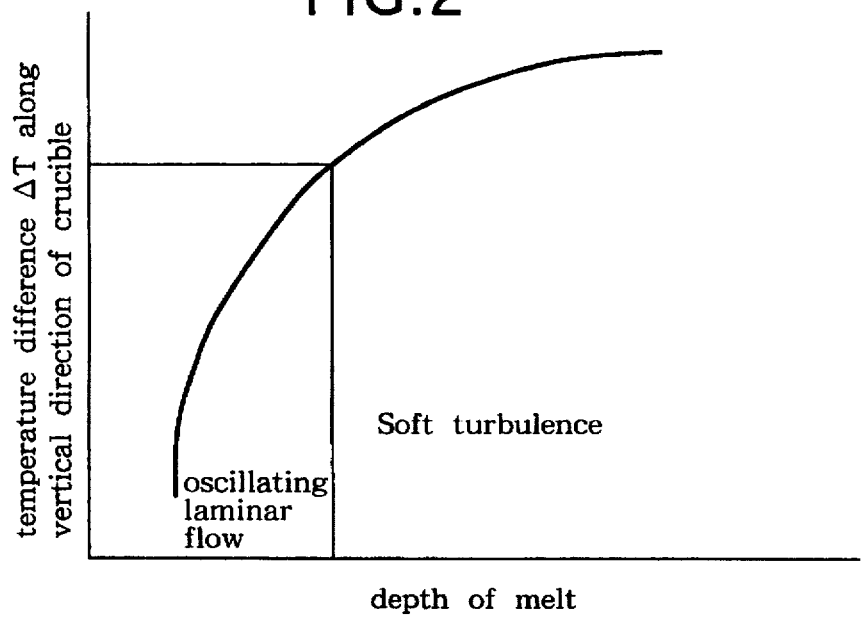
FIG. 2 is a graph showing the effects of the depth of a melt and the temperature difference $\Delta T$ on the melt convection at the interface of crystal growth.
Figure 3:
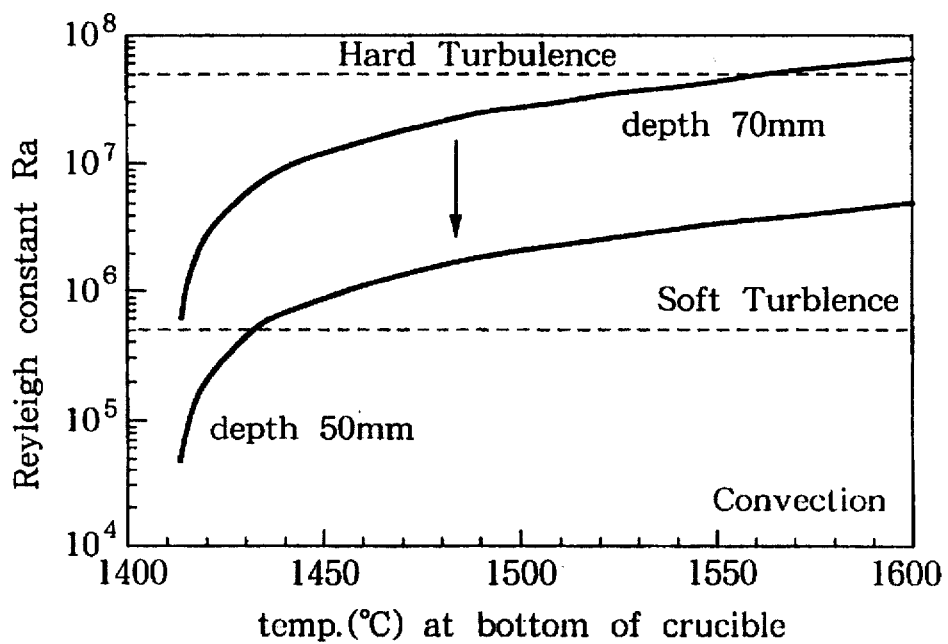
FIG. 3 is a graph showing the relation between a temperature at the bottom of a crucible and Rayleigh constant $R_a$.

When the depth L of the melt is 70 mm, Rayleigh constant $R_a$ deviates in relation with the temperature at the bottom of the crucible, as shown in FIG. 3. When Rayleigh constant $R_a$ is $5 \times 10^5$ or less, the priodic convection easily generates at the interface of crystal growth. When Rayleigh constant $R_a$ exceeds $4 \times 10^7$, the interface of crystal growth comes to an unstable temperature condition due to the formation of a cool zone. When the depth L becomes 50 mm or less, Rayleigh constant is reduced, so that the melt flow is out of soft turbulence.

On the other hand, when Rayleigh constant is in the range of $5 \times 10^5 - 4 \times 10^7$, the state of soft turbulence to accelerate the agitation of the melt is maintained at the interface of crystal growth. Consequently, the impurity distribution in the melt is not introduced into the growing crystal, and the single crystal is grown up form the melt under stabilized temperature condition.

Accounting the relationship shown in FIG. 3, a feed back signal is inputted to a control system so as to make a predetermined temperature difference ΔT in the melt during the crystal growth. As a result, the single crystal can be pulled up from the melt having the same convection mode over the whole length of the crystal along the direction of crystal growth.

The operational condition to change the temperature difference ΔT may be controlled by adjusting the rotational direction or rotation speed of the crucible, or changing a temperature difference along a vertical direction while maintaining the temperature gradient necessary for crystal growth along a vertical direction using a couple of heaters. Consequently, the convection mode is continuously held in the region of soft turbulence, so as to grow the single crystal having impurity distribution made uniform along the direction of crystal growth.

EXAMPLE

A Si source 5 kg was put in a crucible, heated and melted. The formed melt was of 105 mm in depth from the bottom of the crucible to the surface of the melt. The operation of crystal growth was continuted using the melt in this state, until a Si single of crystal 3 kg was obtained.

The depth L of the melt and the temperature difference ΔT were 105 mm and 40° C., respectively, just after the initiation of crystal growth. Rayleigh constant $R_a$ was calculated to $4.75 \times 10^{-7}$, using the volumetric expansion coefficient of the Si melt $\beta = 8.0 \times 10^{-4}$ (at a temperature of 1430° C. or lower), $1.0 \times 10^{-4}$ (above 1430° C.), the thermal diffusivity $\kappa = 2.55 \times 10^{-5}$ m²/sec. and the kinematic viscocity $\nu = 3.0 \times 10^{-7}$ m²/sec..

The temperature difference ΔT became smaller with the decrease of the depth L of the melt consumed for crystal growth, so that Rayleigh constant $R_a$ was reduced below the soft turbulence region. Therefore, the crucible was rotated at a higher speed so as to increase the temperature difference ΔT accounting the relation with the temperature at the bottom of the crucible. As a result, the single crystal was pulled up in the state that almost all the parts of the single crystal were grown up in the soft turbulence state.

As a comparative example, a single crystal was pulled up under the condition of rotating the crucible at a constant rotation speed.

Each single crystal obtained in this way was examined to research impurity distribution along the pulling-up direction, i.e. the direction of crystal growth. The results are shown in FIG. 4.

Figure 4:
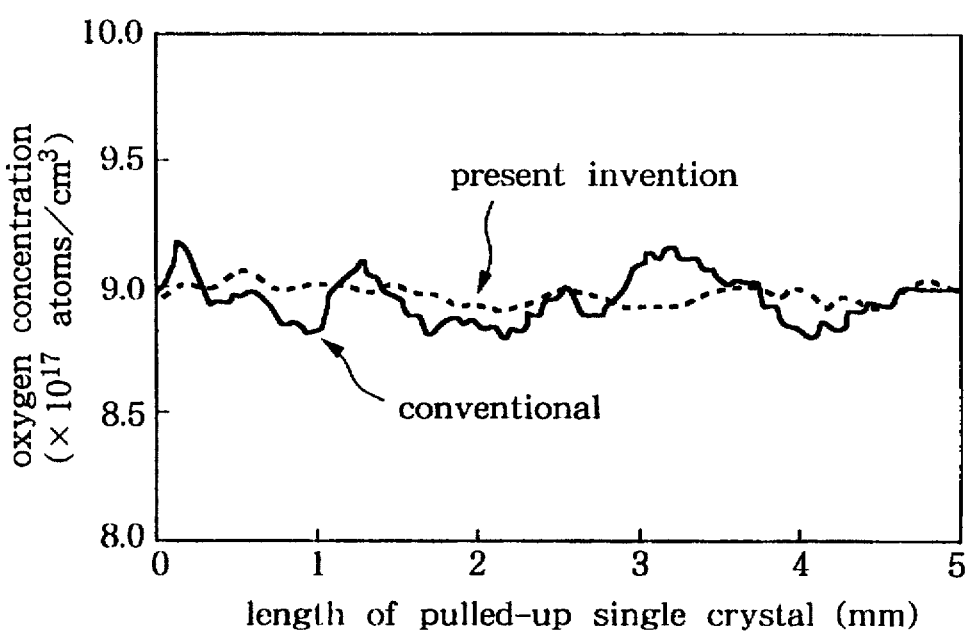
FIG. 4 is a graph comparing the oxygen distribution of a single crystal obtained in the example along the direction of crystal growth with that of a single crystal obtained as a comparative example.

It is noted from FIG. 4 that the single crystal grown up according to the present invention had the impurity distribution whose deviation was suppressed along the direction of crystal growth. This uniform impurity distribution means that the single crystal was grown up from the melt held in a soft turbulence state.

On the contrary, the single crystal in the comparative example had the oxygen distribution which periodically fluctuated along the direction of crystal growth, and the deviation became bigger with the growth of the single crystal. We suppose this uniformity is caused by the reflection of the impurity distribution in the melt to the grown-up single crystal as the transfer of the convection mode toward the periodic flow region. It is apparently recognized from this comparison that the single crystal made uniform in impurity distribution was obtained by controlling the convection state of the melt according to the present invention.

According to the present invention as above-mentioned, when a single crystal is pulled up from a melt, the difference between temperatures at the bottom of a crucible and at the interface of crystal growth is controlled so as to maintain the melt convection mode within a predetermined range, so that the convection mode generated at the interface of crystal growth is held in the region of soft turbulence. Consequently, the single crystal is grown up under the stabilized temperature condition to inhibit the introduction of impurity non-uniformity in the melt into the growing single crystal. As a result, the ratio of the region where the impurity distribution is made uniform along the direction of crystal growth becomes longer, the ratio of the crystal useful as a product is enhanced, and a single crystal of highly-stabilized quality can be produced with high yield.

What is claimed is:

1. A method of growing a Si single crystal, comprising the steps of:

providing a melt in a crucible having a bottom, controlling a difference in temperature ΔT between a temperature at the bottom of said crucible and a temperature at an interface of crystal growth so as to maintain a Rayleigh constant Ra defined by the formula:

$$Ra = g \cdot \beta \cdot \Delta T \cdot L / \kappa \cdot \nu$$

within the range of $5 \times 10^5 - 4 \times 10^7$, wherein g represents the acceleration of gravity, β a volumetric expansion coefficient of said melt, L a depth of the melt, κ represents thermal diffusivity and ν represents kinematic viscosity; and pulling up a single crystal from said melt which is held in a soft turbulence state.

* * * * *

UNITED STATES PATENT AND TRADEMARK OFFICE
CERTIFICATE OF CORRECTION

PATENT NO. : 5,683,504
DATED : November 4, 1997
INVENTOR(S) : Koji Izunome, et al It is certified that error appears in the above-identified patent and that said Letters Patent is hereby corrected as shown below:

Column 2, line 29, "the Rayleigh" should read -- The Rayleigh --.

Column 3, line 25, "single of crystal" should read -- single crystal of --.

Signed and Sealed this

Third Day of March, 1998

Attest:

BRUCE LEHMAN

*Attesting Officer*     *Commissioner of Patents and Trademarks*